(12) United States Patent
Ouellet

(10) Patent No.: US 6,555,441 B2
(45) Date of Patent: Apr. 29, 2003

(54) METHOD OF ALIGNING STRUCTURES ON OPPOSITE SIDES OF A WAFER

(75) Inventor: Luc Ouellet, Granby (CA)

(73) Assignee: Dalsa Semiconductor Inc., Waterloo (CA)

( * ) Notice: Subject to any disclaimer, the term of this patent is extended or adjusted under 35 U.S.C. 154(b) by 0 days.

(21) Appl. No.: 09/923,367

(22) Filed: Aug. 8, 2001

(65) Prior Publication Data

US 2003/0032299 A1 Feb. 13, 2003

(51) Int. Cl.[7] .............................................. H01L 21/76
(52) U.S. Cl. ...................... 438/401; 438/462; 438/975; 257/797
(58) Field of Search ................................ 438/401, 462, 438/975; 257/797; 250/559.3; 356/401

(56) References Cited

U.S. PATENT DOCUMENTS

| | | | | |
|---|---|---|---|---|
| 4,737,033 A | * | 4/1988 | Moldovan et al. | 356/401 |
| 5,821,549 A | * | 10/1998 | Talbot et al. | 250/307 |
| 6,122,174 A | * | 9/2000 | Livengood et al. | 361/736 |
| 6,210,842 B1 | * | 4/2001 | Kim | 430/296 |
| 6,300,670 B1 | * | 10/2001 | Kramer et al. | 257/621 |
| 6,398,348 B1 | * | 6/2002 | Haluzak et al. | 347/63 |

FOREIGN PATENT DOCUMENTS

JP          359172722 A  *  9/1984

OTHER PUBLICATIONS

"Semiconductor Micromaching", S.D. Collins, Department of Electrical Engineering and Computer Science, University of California, Davis, USA, vol. 2, pp. 54–99.

* cited by examiner

*Primary Examiner*—Amir Zarabian
*Assistant Examiner*—Jeff Vockrodt
(74) *Attorney, Agent, or Firm*—Marks & Clerk

(57) ABSTRACT

A method is disclosed for aligning structures on first and second opposite sides of a wafer. First one or more transparent islands are formed on the first side of the wafer at an alignment location. The transparent islands have an exposed front side and a rear side embedded in the wafer. At least one alignment mark is formed on the front side of the transparent island. An anisotropic etch is performed through the second side of said the to form an opening substantially reaching the back side of the transparent island. A precise alignment is then carried out on the alignment mark through the opening and the transparent island. In this way a very precise alignment can be carried out on the back side of the wafer for manufacturing MEMS structures.

24 Claims, 9 Drawing Sheets

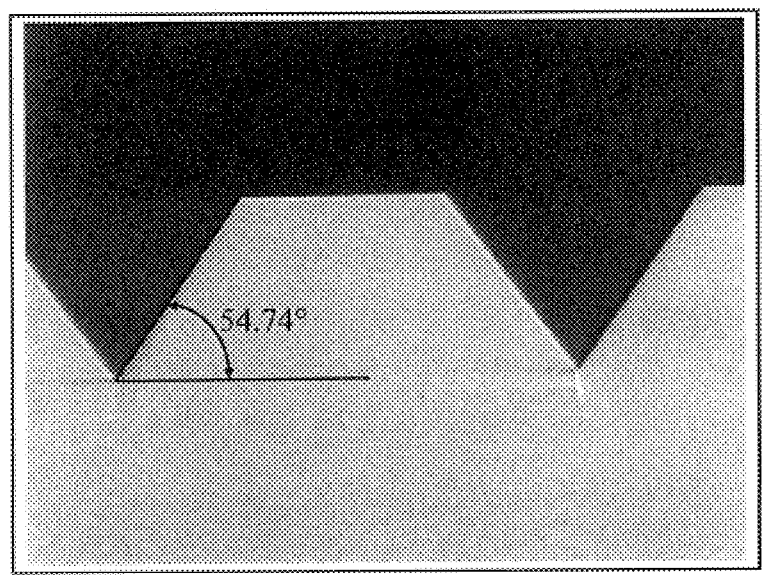
FIG. 6
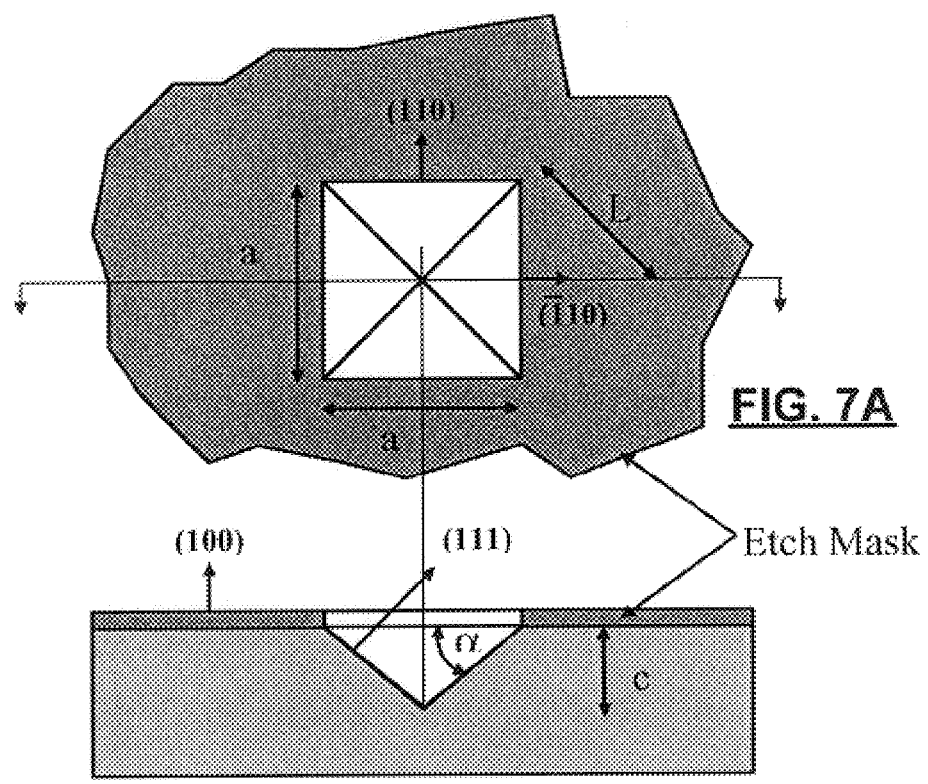
FIG. 7A
FIG. 7B

METHOD OF ALIGNING STRUCTURES ON OPPOSITE SIDES OF A WAFER

BACKGROUND OF THE INVENTION

1. Field of the Invention

This invention relates to the field of microstructure fabrication, and in particular to a method of aligning microstructures on opposite sides of a wafer.

2. Description of Related Art

The manufacturing of Micro-Electro-Mechanical Systems (MEMS) often requires the alignment of structures located on the front side of a silicon wafer to structures located on the back side of the same silicon wafer as to ensure proper machining.

Special alignment systems capable of back side alignment are used to perform the alignment of structures located on the front side of a silicon wafer to structures located on the back side of the same silicon wafer as to ensure proper machining of MEMS. These special systems use split field optics and/or through-the-silicon-wafer infrared imaging to perform 1× direct contact alignment or 1× proximity contact alignment of the structures on both sides of the silicon wafer.

One example of a prior art alignment system is the MA1006 contact aligner manufactured by K&W Gmbh. This system is capable of handling 1× masks of sizes of up to 7"×7" and silicon wafers of up to 6"diameter. The transfer of a 1× mask located on the back side of the silicon wafer into the photoresist also located on the back side of this silicon wafer while aligning this transferred 1× photoresist pattern to the structures already located on the front side of the same silicon wafer is carried out by first illuminating the 1× mask located on the back side of the silicon wafer with an intense infrared light not absorbed by the photoresist also located on the back side of the silicon wafer. Next, through infrared transmission, the dynamic alignment of the 1× mask closely positioned against the photoresist coated back side of the silicon wafer and the structures located on the front side of the same silicon wafer is observed using the image transmitted through a 5×–35× zooming microscope objective and captured from the Charge-Coupled-Device (CCD) infrared sensor of a Hamamatsu alignment camera a resulting infrared imaged magnified by 150×–1000× zoom on a Sony 14" Monitor. The 1× mask and the photoresist coated back side of the silicon wafer are contacted with more or less pressure (0.03 N/cm$^2$–0.16 N/cm$^2$) when proper alignment is achieved. Finally, the photoresist coated on the back side of the silicon wafer is exposed with ultra-violet light of 240 nm–450 nm wavelength to transfer the pattern of the 1× mask into the photoresist.

The resulting alignment of the already existing pattern located on the front side and of the newly transferred 1× pattern into the photoresist of the back side of the wafer is claimed to be of the order of 1 μm.

Another known system is the MA6 contact aligner manufactured by the company Karl Suss, also of Germany. This system is also capable of handling 1× masks of sizes of up to 7"×7" and silicon wafers of up to 6" diameter. In this system, the 1× mask on the back side of the silicon wafer is first illuminated with infrared light. Using a splitfield CCD video camera and through infrared transmission, the alignment of the 1× mask near the back side and the structures of the front side of the silicon wafer are observed using the image transmitted through a 10× microscope objective. The 1× mask and the photoresist coated back side of the silicon wafer are contacted with more or less pressure when proper alignment is achieved. Finally, the photoresist coated on the back side of the silicon wafer is exposed with ultra-violet light as to transfer the pattern of the 1× mask into the photoresist.

The optical resolution of the transferred pattern into the photoresist is claimed to be of the order of 1 μm when using vacuum contact between the 1× mask and the photoresist.

Another system is the contact aligner also manufactured by Karl Suss. Unlike the MA6 aligner, which is capable of aligning wafers of up to 6" in diameter, the MJB 3 UV400 IR 6 contact aligner is only capable of handling 1× masks of sizes of up to 4"×4" and silicon wafers of up to 3".

In this system, the 1× mask on the back side of the silicon wafer is first illuminated with infrared light. Using a split-field Vidicon video camera and through infrared transmission, the alignment of the 1× mask near the back side and the structures of the front side of the silicon wafer is observed using the image transmitted through a 10× microscope objective. The 1× mask and the photoresist coated back side of the silicon wafer are contacted with more or less pressure when proper alignment is achieved. Finally, the photoresist coated on the back side of the silicon wafer is exposed with ultra-violet light as to transfer the pattern of the 1× mask into the photoresist.

The optical resolution of the transferred pattern into the photoresist is also claimed to be of the order of 1 μm when using vacuum contact between the 1× mask and the photoresist.

The EV620 contact aligner manufactured by the company Electronic Visions is also capable of handling 1× masks of sizes of up to 7"×7" and silicon wafers of up to 6" diameter. In this system the 1× mask on the back side of the silicon wafer is first illuminated. Using a splitfield video camera, the alignment of the 1× mask near the back side and the structures of the front side of the silicon wafer is observed using the image transmitted through a 3.6×, 4×, 5×, 10× or 20× objective equipped with digital Zoom. The 1× mask and the photoresist coated back side of the silicon wafer are contacted with more or less pressure (0.5 N to 40N) when proper alignment is achieved. Finally, the photoresist coated on the back side of the silicon wafer is exposed with ultra-violet light to transfer the pattern of the 1× mask into the photoresist.

The alignment accuracy between the transferred patterns into the photoresist of the back side and the patterns of the front side is claimed to be better then about 1 μm.

The OAI 5000 contact aligner manufactured by the company Optics Automation Instrumentation is capable of handling 1× masks of sizes of up to 9"×9" and silicon wafers of up to 8" diameter. In this system the 1× mask on the back side of the silicon wafer is illuminated with infrared light. Using a splitfield video camera and through infrared transmission, the alignment of the 1× mask near the back side and the structures of the front side of the silicon wafer is observed using the image transmitted through a 6× or 32× objective. The 1× mask and the photoresist coated back side of the silicon wafer are contacted with more or less vacuum (2 to 15 inch of mercury) when proper alignment is achieved. Finally, the photoresist coated on the back side of the silicon wafer is exposed with ultra-violet light to transfer the pattern of the 1× mask into the photoresist.

The optical resolution of the transferred pattern into the photoresist is claimed to be 0.73 μm when using 365 nm i-line exposure of the 1× mask into suitable photoresist.

All of these special alignment systems use split field optics and/or through-the-silicon-wafer infrared imaging to perform 1× direct contact alignment or 1× proximity contact alignment of the structures located on the front side of the silicon wafer and structures located on the back side of the same silicon wafer as to ensure proper machining of MEMS. They also all require physical contact between the photoresist and the 1× mask using more or less pressure in order to align the patterns of the front side and the transferred 1× pattern of the back side with alignment accuracy of the order of 1 µm and optical resolution also of the order of 1 µm.

SUMMARY OF THE INVENTION

The invention employs a special manufacturing technique which uses the crystal properties of the silicon wafer to permit the fabrication of thin transparent oxide islands on its front side over which opaque alignment structures are positioned in such a way to be visible through openings which are wet-etched through the surface of the back side and up to the bottom surface of this transparent oxide island. The alignment of the pattern-to-be-transferred on the back side of the facing down silicon wafer can be carried out using a standard 5× Canon wafer stepper by aligning the alignment structures of the mask of the pattern-to-be-transferred to the alignment structures already located on the upper surface of the transparent oxide island.

Accordingly, the present invention provides a method of aligning structures on first and second opposite sides of a wafer, comprising the steps of forming at least one transparent island on the first side of said wafer at an alignment location, said transparent island having an exposed front side and a rear side embedded in said wafer; providing at least one alignment mark on the exposed front side of said transparent island; performing an anisotropic etch through the second side of said wafer to form an opening substantially reaching the rear side of said transparent island; and carrying out a precise alignment on said alignment mark through said opening and said transparent island.

There can be one large island with several alignment marks, but more usually there several smaller islands will be formed, each bearing one or more alignment marks. These are typically opaque structures, for example, of polysilicon.

The openings on the second side of the wafer should normally reach the transparent islands, although the invention will still work so long as they extend sufficiently far to permit the alignment structures to be visible through the openings from the second side of the wafer.

The transparent islands are preferably made using a LOCal Oxydation of Silicon (LOCOS) sequence in a MEMS process as to allow the fabrication of oxide islands on the front side of the water. These are then used as an etch stop layer during etching of the openings, which form observation windows, from the back side of the wafer at a later step of the process.

The alignment structures can be patterned over these oxide islands using a standard Canon 5× wafer stepper so as to be visible from the back side of the wafer through the underlying oxide islands and through the observation windows which cab be etched from the back side of the wafer at a later step of the process.

Preferably, a chemical solution is used to transfer a first poorly aligned thermal oxide hard mask using the major flat and the edges of the silicon wafer as the positioning reference. This hard mask is used to open coarsely aligned observation windows with this chemical solution which performs an anisotropic etching along some crystallographic planes from the back side and all the way through the 625 µm thick silicon wafer as to reach the oxide islands. These observation windows allow the observation of the alignment structures of the front side of the wafer from the back side of the wafer.

The alignment structures of the mask to be aligned on the back side of the wafer can then be properly aligned through these coarsely aligned observation windows with their corresponding alignment structures located over the grown oxide island on the front side of the wafer using a standard 5× Canon wafer stepper. The transferred patterns on the back side of the wafer can also include other alignment marks which can allow shot-by-shot alignment of the remaining masks to be transferred to the back side of the wafer.

BRIEF DESCRIPTION OF THE DRAWINGS

The invention will now be described in more detail, by way of example only, with reference to the accompanying drawings, in which:

FIG. 6 is a sectional view of a {100} oriented silicon wafer after an anisotropic etching in a TMAOH solution using a {110} oriented mask; is a pair of {111} planes oriented at 54.74° with respect to the wafer surface;

FIGS. 7a and 7b are plan and cross sectional views of a {100} oriented silicon wafer after an anisotropic etch in a TMAOH solution using a {110} oriented square etch mask of size (a×a);

DETAILED DESCRIPTION OF THE PREFERRED EMBODIMENTS

Figure 1:
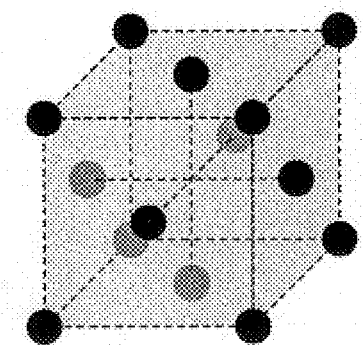
FIG. 1 shows a Face-centered Cubic Silicon Single Crystal.

Single crystal silicon wafers have the face-centered cubic crystal structure shown in FIG. 1. Face-centered cubic crystals are characterized by a series of Six {100} orientation planes shown in FIG. 2; six {110} orientation planes, as shown in FIG. 3; and four {111} orientation planes shown in FIG. 4.

Figure 5:
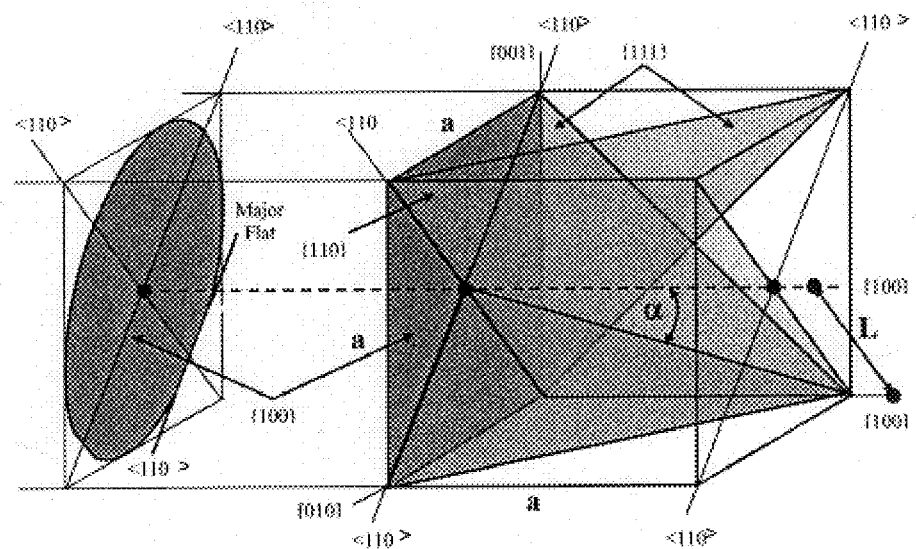
FIG. 5 shows the Relationship Between the Major Flat of {100} Oriented Silicon Wafers and Their Relevant Crystallographic Planes.

The relationship between the major flat of [100] oriented silicon wafers and their relevant crystallographic planes is shown in FIG. 5. It can be shown that the angle between the four {111} orientation planes and the silicon surface is about 54°.

Some liquid phase solutions allow the anisotropic etching of face-centered cubic crystals such as silicon. See, for example, S. A. Campbell, "Semiconductor Manufacturing. Vol. 2: Techniques and Industrial Applications", chapter 2 (Etch Stops) by S. D. Collins, John Wiley & Sons, 1998, p.64.

Figure 2:
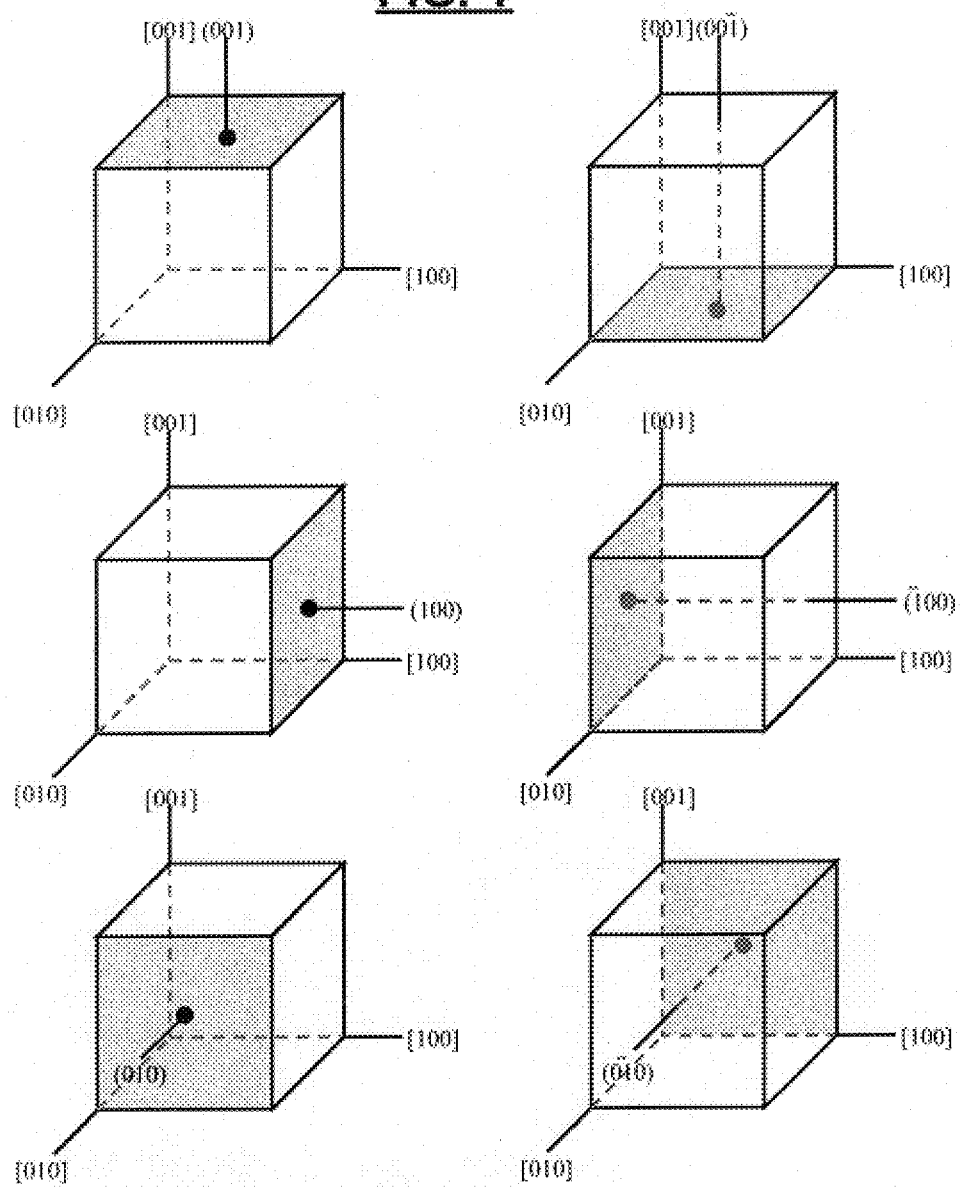
FIG. 2 shows the Miller Indices of the Six Planes of the {100} Family of Planes of the Face-centered Cubic Silicon Single Crystal.
Figure 3:
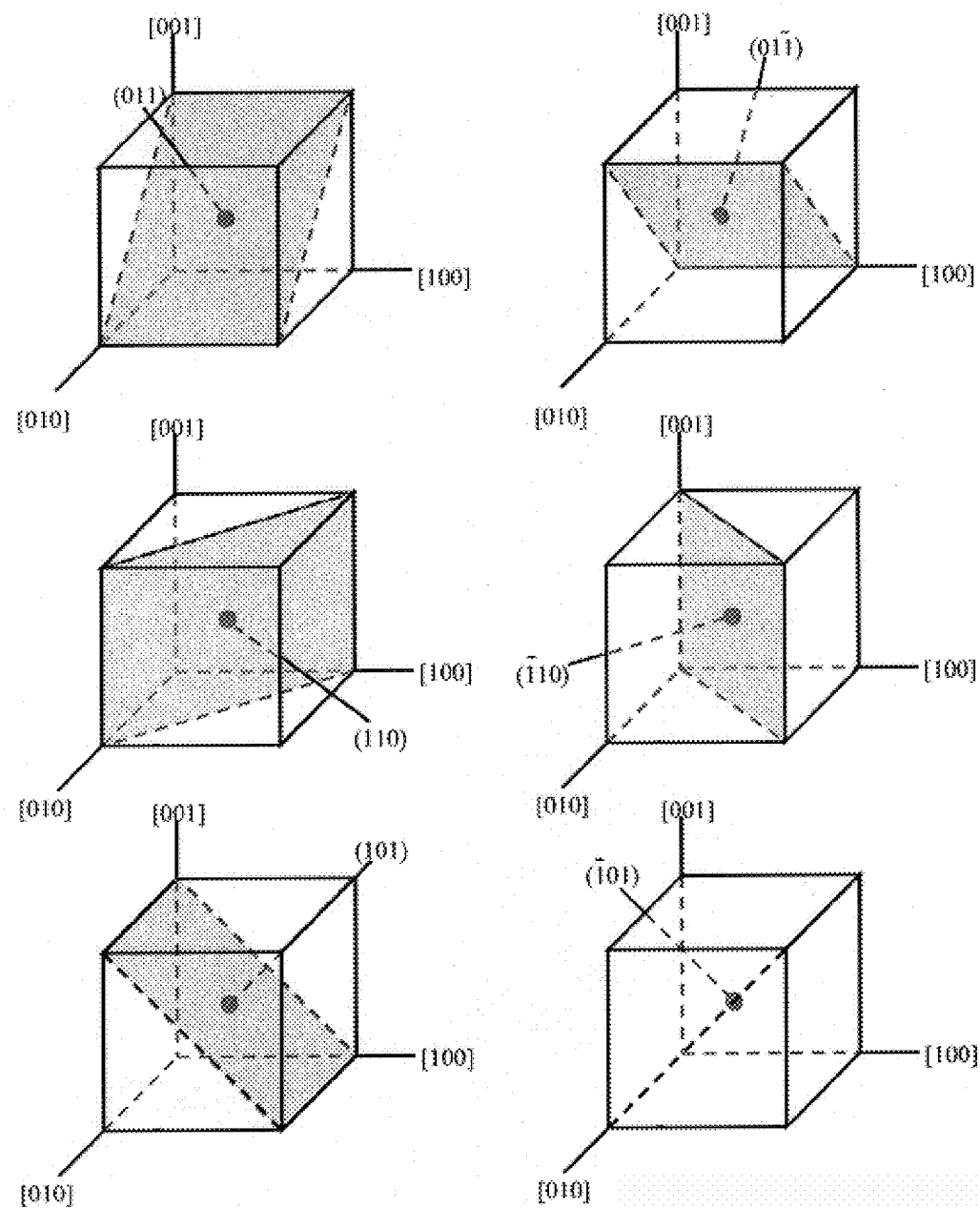
FIG. 3 shows the Miller Indices of the Six Planes of the {110} Family of Planes of the Face-centered Cubic Silicon Single Crystal.
Figure 4:
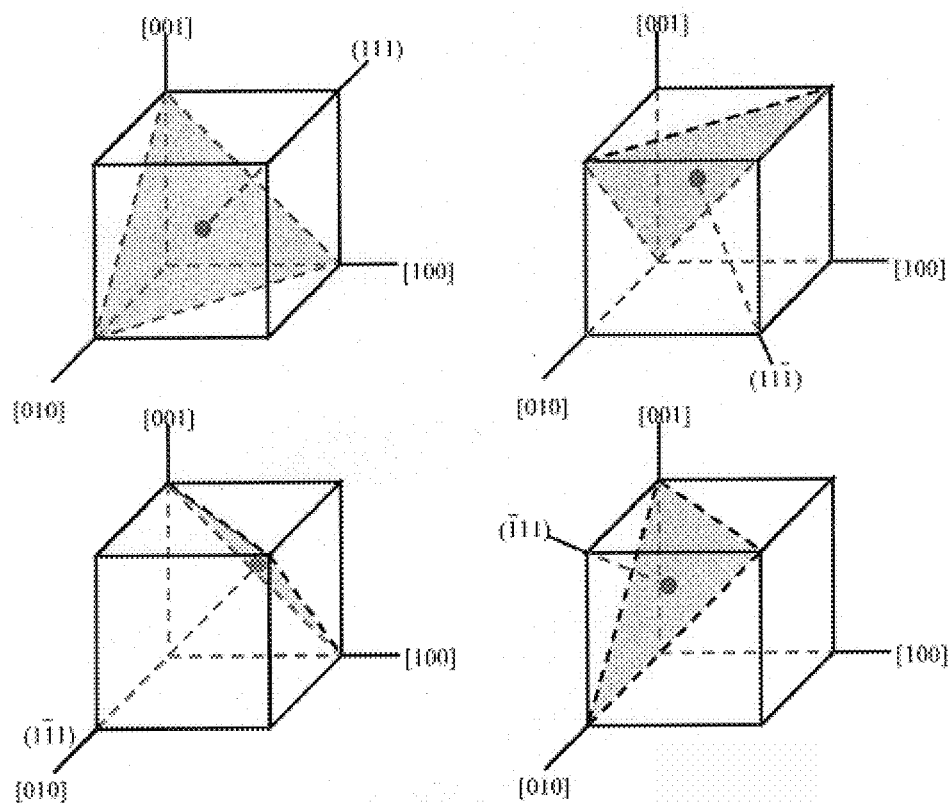
FIG. 4 shows the Miller Indices of the Four Planes of the {111} Family of Planes of the Face-centered Cubic Silicon Single Crystal.

These solutions etch the four {111} orientation planes of FIG. 4 much more slowly then the six {100} orientation planes of FIG. 2 or the six {110} orientation planes of FIG. 3.

The etch rate ratio is used to quantify the anisotropic behavior of these solutions. The etch rate ratio is defined as (Etch rate of {100} planes)/(Etch rate of {111} planes).

Tetramethylammonium hydroxide (TMAOH) solution in water is a suitable substance because it is non-toxic, can be handled easily, is compatible with Complementary Metal Oxide Semiconductor, CMOS, processes, and because TMAOH and water solutions do not decompose below 130° C.

A solution of 25 wt % TMAOH in water at 80° C. etches the {100} planes at a rate of about 27.7 $\mu$m/hour and the {111} planes at a rate of about 0.392 $\mu$m/hour, thus providing an excellent etch rate ratio of about 70:1.

The inventors have found that anisotropic etching of {100} oriented silicon wafers in a TMAOH solution through a {110} oriented mask results in a pair of {111} planes oriented at 54.74° with respect to the wafer surface. A SEM picture of this effect is shown in FIG. 6.

FIGS. 7a and 7b show that the anisotropic etching of {100} oriented silicon wafers in a TMAOH solution using a {110} oriented square mask of size (a×a) results in an inverted square pyramid defined by four {111} planes oriented at 54.74° with respect to the wafer surface. The inverted pyramid typically has a depth of about 0.5×a√42 into the silicon.

The etch depth c is given by the expression $$c = L = \frac{a\sqrt{2}}{2}$$

$$\alpha = \arctan\frac{\sqrt{2}}{2} = 54.74°$$

Figure 8A:
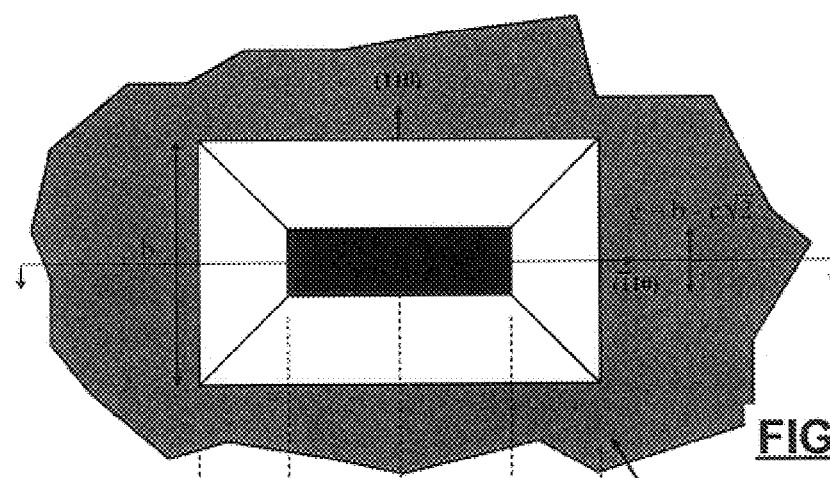
FIGS. 8a and 8b are plan and cross sectional views of a {100} oriented silicon wafer of thickness c after an anisotropic etch performed all the way through the wafer with a TMAOH solution using a {110} oriented rectangular mask of size (a×b)
Figure 8B:
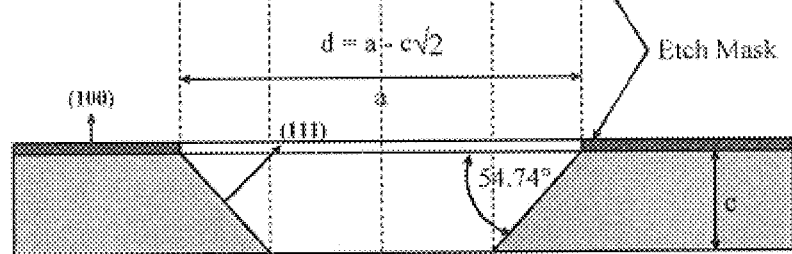

FIGS. 8a and 8b show that an anisotropic etch performed all the way through {100} oriented silicon wafers of thickness c in a TMAOH solution using a {110} oriented rectangular mask of size (a×b) results in an inverted and sloped rectangular via hole of bottom size (d×e) defined by four {111} planes oriented at 54.74° with respect to the wafer surface. In that case, the relationships between the (a×b) size of the mask, the c thickness of the wafer, and the (d×e) bottom size of the sloped rectangular via hole are:

$$d=(a-c\sqrt{2})$$

and $$e=(b-c\sqrt{2})$$

Figure 9A:
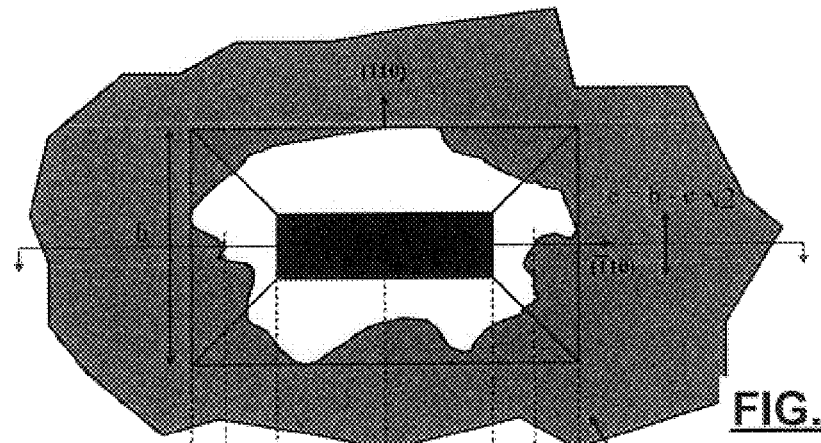
FIGS. 9a and 9b are plan and cross sectional views of a {100} oriented silicon wafers of thickness c after an anisotropic etch performed all the way through with a TMAOH solution using an arbitrary shaped mask of external size (a×b) as measured using {110} directions.
Figure 9B:
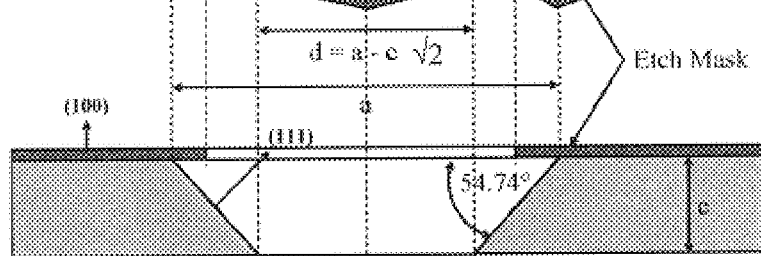

FIGS. 9a and 9b show that the anisotropic etch performed all the way through {100} oriented silicon wafers of thickness c in a TMAOH solution using an arbitrary shaped mask of external size (a×b) as measured using {110} directions also results in an inverted and sloped rectangular via hole of bottom size (d×e) defined by four {111} planes oriented at 54.74° with respect to the wafer surface. The relationships between the (a×b) size of the mask, the c thickness of the wafer, and the (d×e) bottom size of the sloped rectangular via hole remain the same as above.

Figure 10:
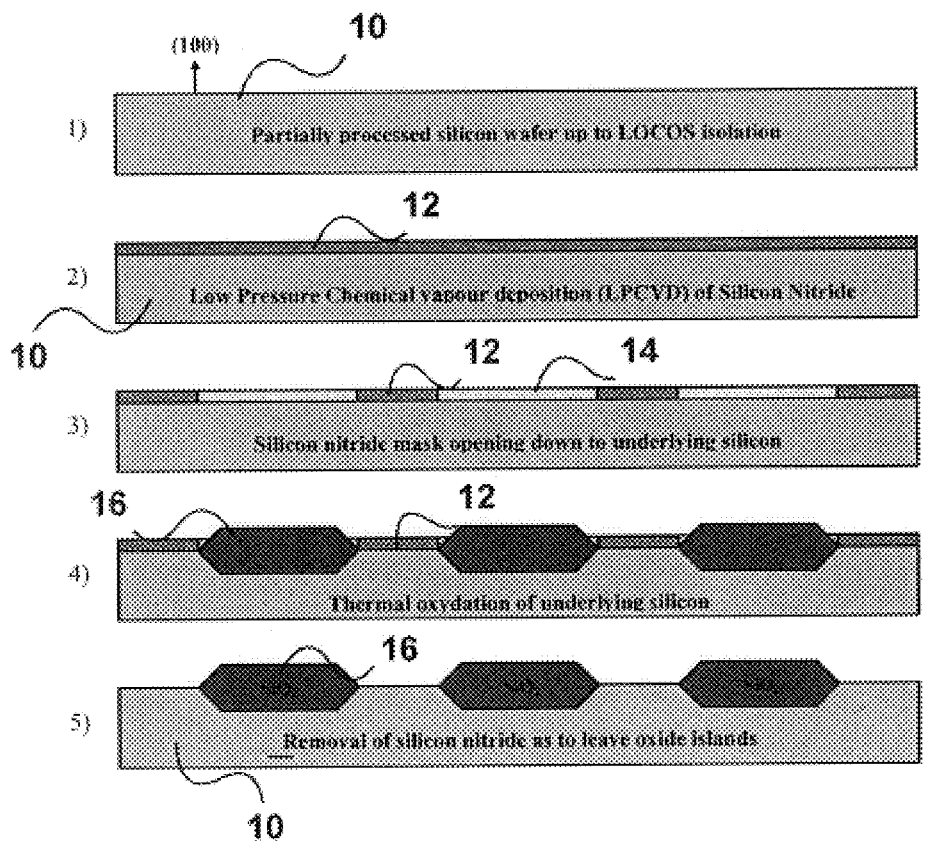
FIG. 10 shows a LOCal Oxidation Of Silicon (LOCOS) isolation process.

FIG. 10 shows the LOCal Oxydation of Silicon (LOCOS) process resulting in the fabrication of oxide islands on the front side of the wafer. This LOCOS isolation process uses oxygen at high temperature to locally convert the silicon which is unprotected by silicon nitride to silicon oxide. The LOCOS process sequence is integrated in the complete MEMS process and allows the local growth of thermal oxide at unprotected locations of the front side of the wafer. The oxide islands are used as an etch stop layer which stops the etching action of TMAOH at a later step in the process.

First a silicon nitride layer 12 is deposited on the (100) face partially processed wafer 10. The mask 12 is patterned to form openings 14 exposing the underlying silicon. A thermal oxidation step of the underlying silicon is then carried out to form transparent silicon dioxide islands 16. This step is followed by removal of the silicon nitride mask to leave the transparent oxide islands 16. Thermal oxidation temperatures are typically between 900 and 1200° C.

Figure 11:
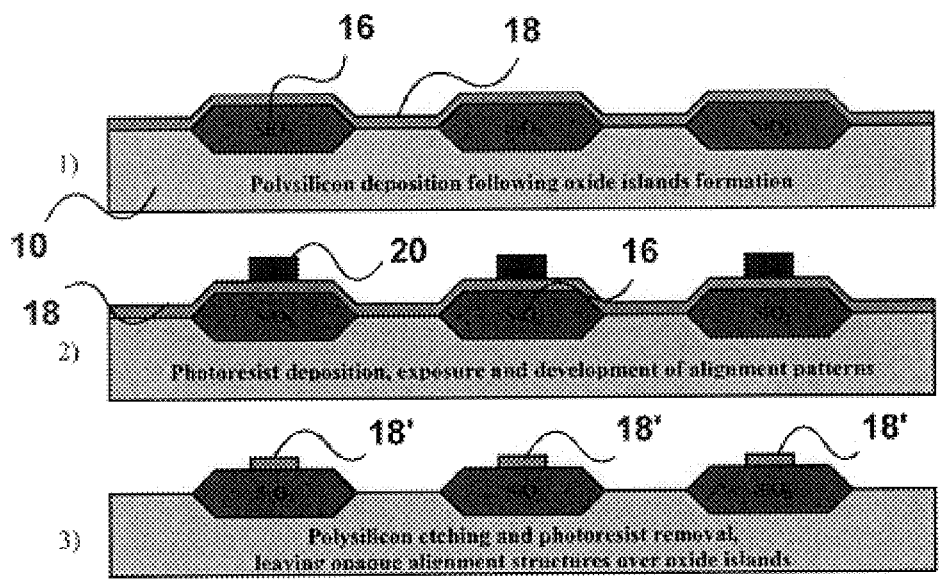
FIG. 11 shows the placement of alignment structures over oxide islands.

FIG. 11 shows the process resulting in the patterning of alignment structures wafer using a standard 5× Canon wafer stepper over the oxide islands of the front side of the wafer. These high resolution alignment structures are made of an opaque material such as polysilicon which will be used as a contrast material when observed from the back side of the wafer through the underlying oxide island and through an observation window which will be etched from the back side of the wafer using TMAOH.

In FIG. 11, a polysilicon layer 18 is deposited over the oxide islands 16. A photoresist 20 is applied and patterned to leave exposed polysilicon 18. This is subsequently etched away and the residual photoresist 20 removed to leave the alignment structures 18' formed of the residual polysilicon.

Figure 12:
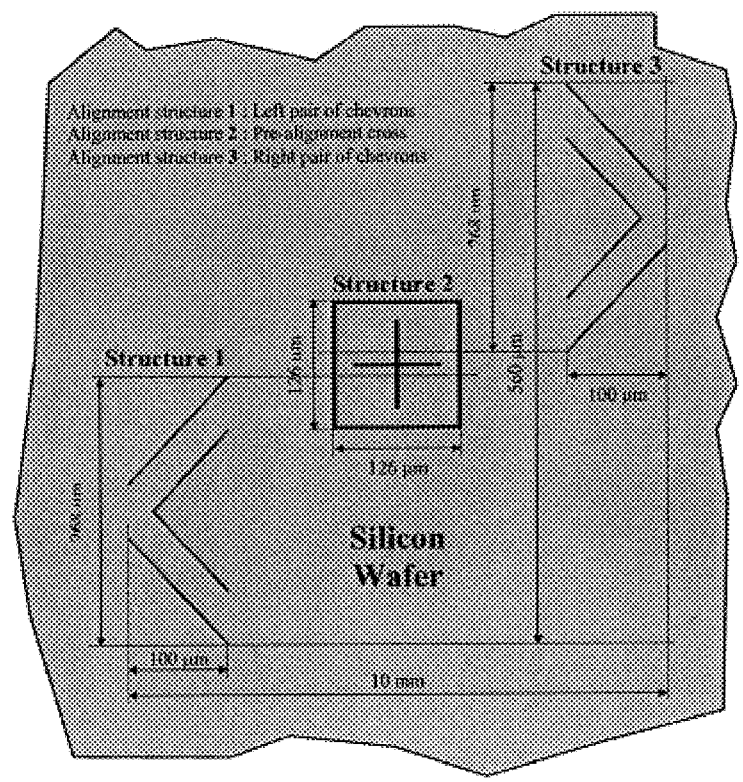
FIG. 12 shows the triplet of alignment structures on the front side of the wafer.

FIG. 12 is an example showing three high resolution alignment structures to be patterned over the oxide islands on the front side of the wafer using a standard 5× Canon wafer stepper. Each one of the three alignment structures of the triplet of alignment structures is located on an independent oxide island to maximize their spacing, thus maximizing the alignment accuracy, and to minimize the total area of the observation windows to be opened from the back side of the wafer so as to minimize the risk of oxide island perforation under the action of the vaccum chuck holding the wafer in position during alignment.

Figure 13:
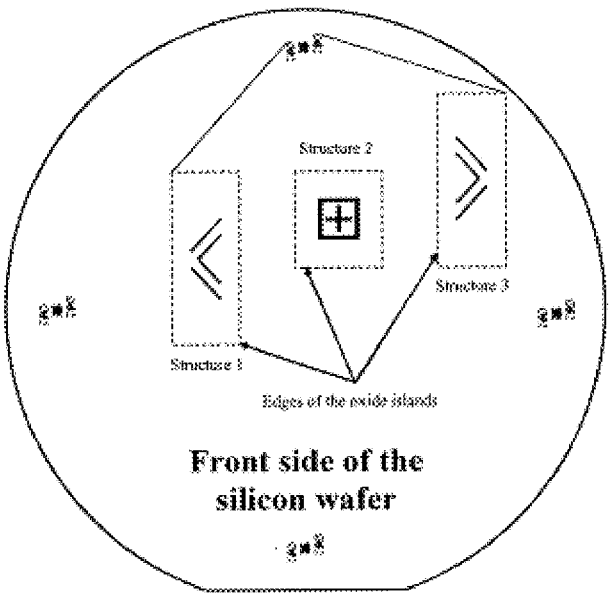
FIG. 13 shows an example of the position of triplets of alignment structures on a {100} wafer.

FIG. 13 is an example showing the position of triplets of alignment structures on a {100} silicon wafer using a standard 5× Canon wafer stepper. This figure shows that the boundaries of the oxide islands are outside and farther away from the rectangular boundaries of the alignment structures with a minimum overlap in each directions of about 100 µm. This minimum overlap is about 100 µm because the blind positioning of the back side mask which allows the opening of the various observation windows has a tolerance of about ±60 µm in all directions when the major flat and the edge of the wafer are used for reference. This overlap ensures that the top of the TMAOH etched observation windows will not reach a point outside their respective oxide islands. High performance back side alignment is then possible using the transparent oxide islands and the visible-from-the-back-side alignment structures through the observation window.

Figure 14:
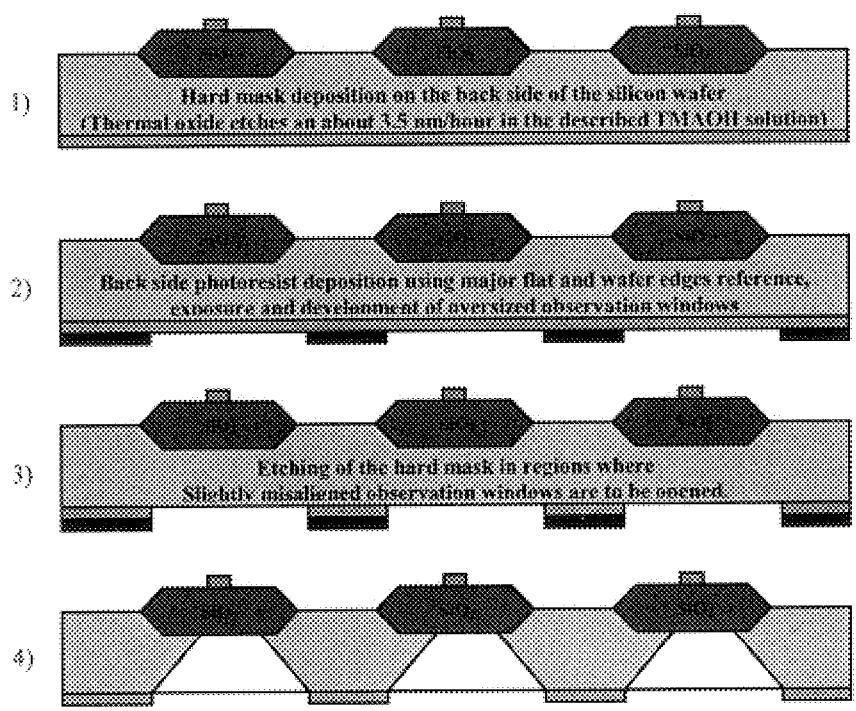
FIG. 14 shows the formation of the observation windows from the back side of a {100} silicon wafer and up to the oxide islands.

FIG. 14 shows the process resulting in the patterning of the observation windows from the back side of a {100} silicon wafer using a standard 5× Canon wafer stepper. The results show that a thermal oxide hard mask is etched at about 3.5 nm/hour with the described TMAOH solution. Since the etching of the 625 µm thick and {100} oriented silicon wafer at a rate of about 27.7 µm/hour will be completed in about 22.6 hours, the hard mask etch rate ratio of about 8000:1 reduces the hard mask consumption to about 80 nm. The hard mask used to pattern the observation window has to be properly sized to compensate for the 54.74° slope shown in FIG. 8 over a complete wafer thickness of about 625 µm.

Figure 15:
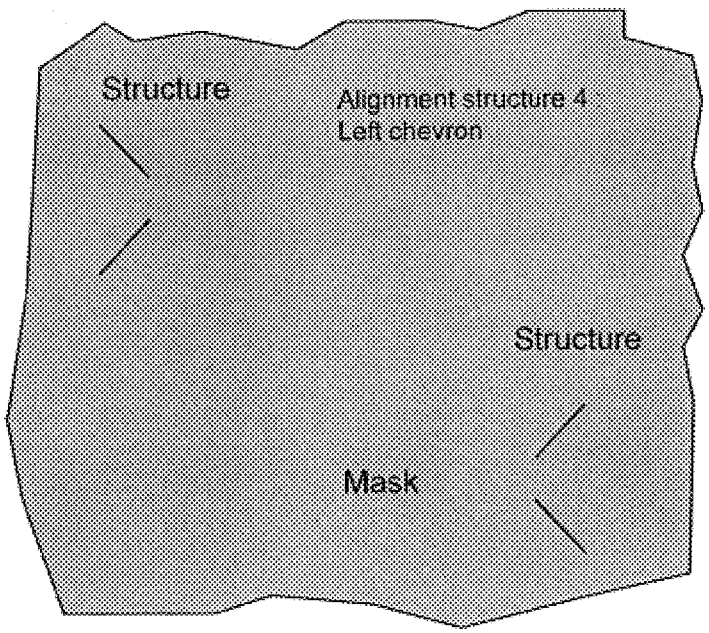
FIG. 15 shows the doublet of alignment structures on the mask used to align the mask to the wafer using the triplets of alignment structures seen through the observation windows.

FIG. 15 shows an example of two alignment structures present on the mask to be aligned on the back side of the wafer a standard 5× Canon wafer stepper. Each one of the two alignment structures of the doublet of alignment structures is to be aligned on the back side of the wafer through its corresponding grown oxide island to its corresponding alignment structure of the triplet present on the other side of its corresponding grown oxide island present on the front side of the wafer.

Figure 16:
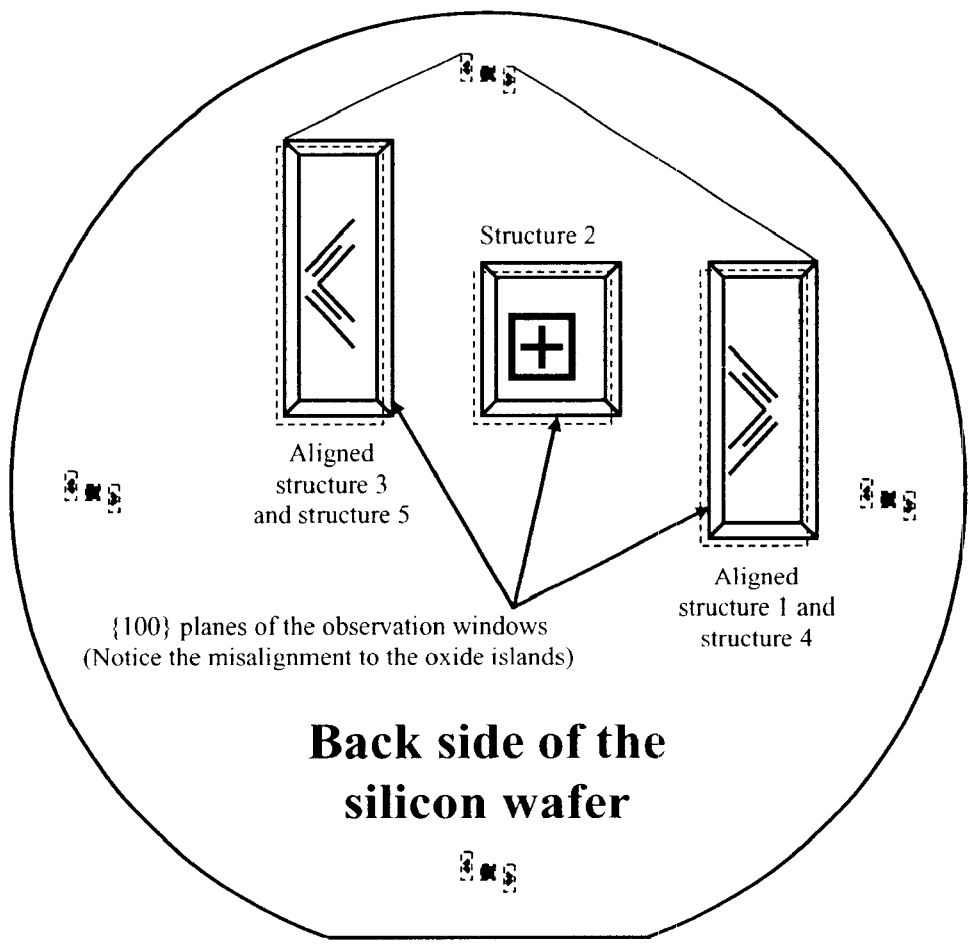
FIG. 16 shows an example of the alignment of doublets of the mask aligned on the back side of a {100} silicon wafer to the visible-from-the-back-side triplets observed through the oxide of misaligned observation windows.

FIG. 16 is an example showing the alignment of doublets of the mask aligned on the back side of a {100} silicon wafer to the visible-from-the-back-side triplets observed through the oxide of misaligned observation windows a standard 5× Canon wafer stepper. This Figure shows that even if the blind positioning of the back side mask that allowed the opening of the various observation windows resulted in a misalignment of the observation windows by up to about ±60 µm in all directions when simply using the major flat and the edge of the wafer for alignment, proper back side alignment is possible because the doublets can be aligned through the oxide island and the observation window to the visible-from-the-back-side triplets.

The sequence for back side alignment is as follows: First, a standard 5× Canon wafer stepper finds the optimum alignment of the first doublet. It looks for the first pre-alignment cross (structure 2), then aligns the right pair of chevrons of the front side (structure 3) to the right chevron of the 5× mask (structure 5) and the left pair of chevrons of the front side (structure 1) and the left chevron of the 5× mask (structure 4) and then records the relative position of the 5× mask and of the wafer.

The 5× Canon wafer stepper finds the optimum alignment of the second, third and fourth doublets using the same procedure and again records the relative position of the mask and of the wafer for these three other locations.

The 5× Canon wafer stepper then calculates the best relative position using the four relative positions and prints the pattern to be transferred, shot-by-shot and in the focal plane of the back side of the wafer so as to cover the whole wafer surface with the patterns to be transferred to the back side of the wafer. The transferred patterns on the back side of the wafer can include other alignment marks which can be used to align shot-by-shots the remaining masks to be transferred to the back side of the wafer.

Many variations of the example described will be apparent to the person skilled in the art. For example, the silicon wafers could be replaced by gallium arsenide, indium phophide or germanium wafers since they all have a face-centered cubic crystal structure.

The 25 wt % TMAOH in water solution (TMAOH/water) could have a different concentration ranging from 0.5 wt % TMAOH in water to 50 wt % in water. The temperature of the TMAOH/water solutions could be different than 80° C. ranging from 60° C. to 130° C. Isopropyl alcohol (IPA) could be added to the TMAOH/water solutions up to 20 vol % as to modify the anisotropic etch properties of the solution and improve the etching characteristics of P-Type silicon. $(CH_3)_4NOH$ could be added to the TMAOH/water solutions up to 30 vol % so as to modify the anisotropic etch properties of the solution and the selectivity to the hard masks.

Hydrogen peroxide, $H_2O_2$, could be added to the TMAOH/water solutions up to 10 vol % as to prevent the formation of hillocks and to use its oxidation potential to prevent the formation of hydrogen bubbles during etching.

Silicon could be added to the TMAOH/water solutions to dope it.

TMAOH could be replaced in the upper solutions by tetraethylammonium hydroxide, TEAOH; an alkali metal hydroxide, such as: KOH, NaOH, LiOH, RbOH or CsOH; by ammonium hydroxide, thus forming and ammonium hydroxide and water (AHW) solution; or by various hydrazine solutions such as hydrazine/water, hydrazine/polycatechol, hydrazine/isopropanol/water; by Ethylenediamine/pyrocatechol/water solutions or amine gallates solutions.

The LOCOS process which allows the formation of the oxide islands could be replaced by another fabrication process if the resulting oxide allows the stopping effect of the anisotropic etch solution. Exemplary alternate fabrication processes include Plasma Enhanced Chemical Vapor Deposition, PECVD; Low Pressure Chemical Vapor Deposition, LPCVD; Metal Organic Chemical Vapor Deposition, MOCVD; Electron Cyclotron Resonance Deposition; Radio Frequency Sputtering; and Flame Hydrolysis.

The oxide islands could be replaced by islands of another material if the resulting material allows the stopping effect of the anisotropic etch solution. These alternate materials include undoped glasses or glasses doped with: Phosphorus, Boron, Germanium or Titanium.

If the size of the various alignment structures of a given alignment mark is small enough, or if the oxide island is strong enough, it is possible to group the alignment structures of the alignment mark on a single island and to have only one observation window to reach this alignment mark from the back side of the wafer.

The described process uses a standard 5× Canon wafer stepper. This equipment may be replaced, for example, by a 20× wafer stepper; a 10× wafer stepper; a 1× proximity aligner; or a 1× contact aligner.

The Canon equipment could be replaced by other exposure equipment manufactured by another manufacturer, such as Nikon, ASML; Ultratech; Perkin Elmer; Silicon Valley Group; Karl Suss; Electronic Visions; K&W Gmbh; Optics Automation Instrumentation.

The number of alignment marks (Left chevron structure, pre-alignment structure and right chevron structure) can be different then the proposed four. The minimum number is about two and the maximum number is about 1000.

The position of the alignment marks can be different then the examples. The alignment marks can be different than the proposed set of left chevron, pre-alignment and right chevron. The alignment equipment type, the equipment manufacturer or the user's requirements will dictate the design of the alignment marks.

The proposed polysilicon material can be replaced by another opaque material such as other semiconductor materials such as doped polysilicon, silicides or polycides; and metallic materials such as aluminum alloys, copper, molybdenum, tungsten, titanium-tungsten, titanium nitride.

If standard 1× exposure equipment is used, the simultaneous alignment of all alignment marks indicates optimum alignment and there is no need to record the relative position of the mask and of the wafer and to perform a calculation of the optimum position.

The boundaries of the oxide islands are outside and farther away from the rectangular boundaries of the alignment structures with a proposed minimum overlap in each directions of about 100 $\mu$m. If the blind alignment of the back of the wafer using the major flat or the edges of the wafer or other means provides a better tolerance then the mentioned ±60 $\mu$m in all directions, it would be possible to reduce the proposed overlap of 100 $\mu$m to a lower value and still prevent the top of the TMAOH etched observation windows to not reach a point outside their respective oxide islands.

If the etching solution has a much different etch rate than the observed 27.7 $\mu$m/hour rate of the proposed TMAOH/water solution or if the hard mask has a different etch rate than the observed 3.5 nm/hour of the proposed thermal oxide, then the thickness of the hard mask can be very different from the proposed 80 nm so as to prevent the total erosion of hard mask during the etching of the observation windows.

The main application of the invention is in the manufacturing of Micro-Electro-Mechanical Systems (MEMS), thus integrating electronics functions and mechanical functions. Optics functions can also be integrated so as to achieve the fabrication of Micro-Opto-Electro-Mechanical Systems (MOEMS). Biological or medical functions can also be integrated as to achieve microfluidics devices such as biochips, laboratopry-on-a-chip (LOAC) or micro-total analysis systems ($\mu$-TAS).

This described process provides a special manufacturing technique which prevents the use of these special alignment systems and which allows the use of standard high performance steppers capable of better resolutions with 5× masks.

I claim:

1. A method of aligning structures on first and second opposite sides of a wafer, comprising the steps of:
   forming at least one transparent island on the first side of said wafer at an alignment location, said transparent island having an exposed front side and a rear side embedded in said wafer;
   providing at least one alignment mark on the exposed front side of said transparent island;
   performing an anisotropic etch through the second side of said wafer to form a window opening substantially reaching the rear side of said transparent island with said transparent island acting as an etch stop; and
   carrying out a precise alignment on said alignment mark through said window opening and said transparent island.

2. A method as claimed in claim 1, wherein said wafer has a face-centered cubic crystal structure.

3. A method as claimed in claim 1, wherein said wafer is oriented in a {100} plane and said anisotropic etch is performed through a {110} oriented mask to form an inverted pyramidal opening defined by four {111} planes.

4. A method as claimed in claim 3, wherein said wafer is silicon.

5. A method as claimed in claim 4, wherein said anisotropic etch is performed with a solution of tetramethylammonium hydroxide.

6. A method as claimed in claim 4, wherein said at least one transparent island comprises silicon dioxide.

7. A method as claimed in claim 6, wherein said silicon dioxide is formed by local oxidation of said silicon wafer.

8. A method as claimed in claim 7, wherein said local oxidation is performed by thermal oxidation.

9. A method as claimed in claim 8, wherein said thermal oxidation is performed through a silicon nitride mask.

10. A method as claimed in claim 1, wherein said transparent islands are made by a process selected from the group consisting of: PECVD, LPCVD, MOCVD, Electron cyclotron resonance deposition; frequency radio sputtering, and flame hydrolysis.

11. A method as claimed in claim 1, comprising a plurality of said transparent islands, each bearing at least one said alignment mark.

12. A method as claimed in claim 11, comprising a single transparent window bearing a plurality of said alignment marks.

13. A method as claimed in claim 1, wherein said at least one alignment mark is created by forming an opaque alignment structure on said at least one transparent window.

14. A method as claimed in claim 13, wherein said alignment structure is selected from the group consisting of a cross and chevrons.

15. A method as claimed in claim 13 wherein said alignment structure is made of polysilicon.

16. A method as claimed in claim 1, wherein a hard mask is formed on the second side of said wafer, said hard mask having a respective opening corresponding said at least one transparent island, and said window openings substantially are formed by performing an anisotropic etch through said hard mask.

17. A method as claimed in claim 16, wherein said hard mask is made of thermal oxide.

18. A method as claimed in claim 1, wherein after carrying out side precise alignment with said at least one alignment mark on the first side of the wafer, at least one second alignment mark, correlated with said at least one alignment mark on the first side of the wafer, is formed on the second side of said wafer for use in subsequent processing on the second side of said wafer.

19. A method of aligning structures on first and second opposite sides of a silicon wafer, comprising the steps of:

locally oxidizing portions of the first side of said wafer to form at least one transparent island having an exposed front side and a rear side embedded in said wafer;

patterning at least one alignment mark on the front side of said at least one transparent island;

performing an anisotropic etch through the second side of said wafer to form a window opening substantially reaching the rear side of said transparent island using said transparent island as an etch stop; and carrying out a precise alignment on said alignment mark through said window opening and said transparent island.

20. A method as claimed in claim 19, wherein said anisotropic etch is carried out through a hard mask on the second side of said wafer.

21. A method as claimed in claim 20, wherein said hard mask is formed of thermal oxide.

22. A method as claimed in claim 20, wherein said wafer is oriented in a {100} plane and said anisotropic etch is performed through a {110} oriented mask to form an inverted pyramidal opening defined by four {111} planes.

23. A method as claimed in claim 22, wherein said anisotropic etch is performed with a solution of tetramethylammonium hydroxide.

24. A method as claimed in claim 19, wherein at least one alignment mark correlated with said at least one alignment on the first side of said wafer is formed on said second side of said wafer following said precise alignment step to permit precise subsequent processing of said wafer from said second side.

* * * * *